(12) United States Patent
Park et al.

(10) Patent No.: US 10,504,936 B2
(45) Date of Patent: Dec. 10, 2019

(54) STRETCHABLE DISPLAY DEVICE

(71) Applicant: SAMSUNG DISPLAY CO., LTD., Yongin-si, Gyeonggi-Do (KR)

(72) Inventors: Gyung Soon Park, Seoul (KR); Il-Joo Kim, Hwaseong-si (KR); Jun Ki Jeong, Anyang-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/988,711

(22) Filed: May 24, 2018

(65) Prior Publication Data
US 2019/0139994 A1 May 9, 2019

(30) Foreign Application Priority Data
Nov. 7, 2017 (KR) .................. 10-2017-0147401

(51) Int. Cl.
H01L 27/12 (2006.01)
(52) U.S. Cl.
CPC ...... H01L 27/1244 (2013.01); H01L 27/1218 (2013.01)
(58) Field of Classification Search
CPC .................. H01L 27/1244; H01L 27/1218
See application file for complete search history.

(56) References Cited

U.S. PATENT DOCUMENTS

| 8,552,299 | B2 | 10/2013 | Rogers et al. |
| 8,729,524 | B2 | 5/2014 | Rogers et al. |
| 8,883,287 | B2 | 11/2014 | Boyce et al. |
| 8,905,772 | B2 | 12/2014 | Rogers et al. |
| 2008/0015723 | A1 | 1/2008 | Chen et al. |
| 2008/0157235 | A1 | 7/2008 | Rogers et al. |
| 2013/0041235 | A1 | 2/2013 | Rogers et al. |
| 2013/0140649 | A1 | 6/2013 | Rogers et al. |
| 2014/0340857 | A1 | 11/2014 | Hsu et al. |
| 2015/0243214 | A1* | 8/2015 | Jeong ............... G09G 3/3233 345/214 |
| 2016/0055807 | A1* | 2/2016 | Lee ................. G02F 1/134336 345/205 |
| 2016/0268352 | A1* | 9/2016 | Hong ................ H01L 27/3218 |
| 2017/0278920 | A1 | 9/2017 | Park et al. |

FOREIGN PATENT DOCUMENTS

| KR | 10-2016-0118459 | 10/2016 |
| KR | 10-2016-0130062 | 11/2016 |

* cited by examiner

*Primary Examiner* — Yosef Gebreyesus
(74) *Attorney, Agent, or Firm* — F. Chau & Associates, LLC

(57) ABSTRACT

A stretchable display device includes: a first pixel substrate includes a first body part and a first hinge part connected to the first body part; a second pixel substrate includes a second body part and a second hinge part connected to the second body part. A second direction neighboring cutout pattern is disposed between the first hinge part connected to the first body part and the second hinge part connected to the second body part; a first power line disposed at the first hinge part connected to the first body part and a second power line disposed at a second hinge part is connected to the second body part. The first power line and second power line are disposed at substantially equal distances in the first direction based on a reference line extending in correspondence to the second direction neighboring cutout pattern.

22 Claims, 9 Drawing Sheets

STRETCHABLE DISPLAY DEVICE

CROSS-REFERENCE TO RELATED APPLICATION

This application claims priority to and the benefit of Korean Patent Application No. 10-2017-0147401 filed in the Korean Intellectual Property Office on Nov. 7, 2017, the entire contents of which are incorporated by reference herein.

TECHNICAL FIELD

Embodiments of the inventive concept relates to a display device. More particularly, the embodiments of the inventive concept relates to a stretchable display device.

DISCUSSION OF THE RELATED ART

Recently, a flexible display device has been developed in which the display may be bent or rolled. In addition, a stretchable display device having stretchability in at least one direction has been developed. The aforementioned types of display devices may be transformed into a predetermined form or may be transformed into various forms according to a user's preference. Such display devices are desirable because they are capable of being carried by the user in relatively compact form, and then bent, rolled out or stretched in a manner that is desired by the user.

Such bendable and/or stretchable display devices may be constructed of a plurality of pixel substrates that may be arranged in a matrix along row and column directions. Each of the pixel substrates may be arranged in manner resembling an island, and there may be a hinge part configured to connect the island to at least one of the adjacent pixel substrates.

The elasticity of the stretchable display device should be maintained, even if the stretchable display device is stretched from an externally applied force. However, as consumer demand for display devices with enhanced resolution continues to increase, the resolution of the stretchable display device has also increased. Display devices with increased resolution may have a construction in which the number of wires utilized in a limited area also increases. Accordingly, a construction of a bendable or stretchable display device with an increased amount of wires in a limited area may increase a possibility that interference or a short between the wires is induced.

When the stretchable display device is stretched, and a hinge part is twisted, contact may be generated between adjacent hinge parts that may cause interference in the output of the display device. Alternatively, a short may be generated between the wires disposed in the adjacent hinge parts that may degrade display quality or may result in a failure of the device to function.

The above discussion is provided only to enhance understanding of the relevant art, and does not constitute an admission of prior art.

SUMMARY

Embodiments of the inventive concept provide a stretchable display device in which interference or a short between wires disposed in adjacent hinge parts may be minimized.

A stretchable display device according to an exemplary embodiment of the inventive concept includes: a first pixel substrate including a first body part and a first hinge part connected to the first body part; a second pixel substrate including a second body part and a second hinge part connected to the second body part and adjacent to the first pixel substrate in a first direction on a plane; a second direction neighboring cutout pattern disposed between the first hinge part connected to the first body part and the second hinge part connected to the second body part; a first power line disposed at the first hinge part connected to the first body part and applied with a first power voltage; and second power line disposed at the second hinge part connected to the second body part and applied with the first power voltage. The first power line and the second power line are disposed at substantially equal distances in the first direction based on a reference line extending in correspondence to the second direction neighboring cutout pattern in a second direction perpendicular to the first direction.

In an embodiment of the inventive concept, the first power line and the second power line may be disposed with a symmetrical structure based on the reference line.

In an embodiment of the inventive concept, a third power line may be disposed at the first hinge part connected to the first body part and applied with a second power voltage, and a fourth power line may be disposed at the second hinge part connected to the second body part and applied with the second power voltage. The third power line and the fourth power line may be disposed at about the same distance in the first direction based on the reference line.

The third power line and the fourth power line may be disposed with the symmetrical structure based on the reference line.

In an embodiment of the inventive concept, a first data line may be disposed at the first hinge part connected to the first body part and applied with a first data voltage, and a second data line may be disposed at the second hinge part connected to the second body part and applied with a second data voltage may be further included, and the first data line and the second data line may be disposed at about the same distance based on the reference line in the first direction.

The first data line may be disposed between the first power line and the third power line, and the second data line may be disposed between the second power line and the fourth power line.

The first power line may be disposed closer to the reference line than the third power line, and the second power line may be disposed closer to the reference line than the fourth power line.

The third power line may be disposed closer to the reference line than the first power line, and the fourth power line may be disposed closer to the reference line than the second power line.

In an embodiment of the inventive concept, there may include a third pixel substrate connected to the second pixel substrate in the second direction on a plane, a fourth pixel substrate connected to the first pixel substrate in the second direction on a plane, and a first direction neighboring cutout pattern disposed between the second pixel substrate and the third pixel substrate and between the first pixel substrate and the fourth pixel substrate.

The first power line may be connected to the fourth pixel substrate and disposed in a zigzag pattern that bypasses the first direction neighboring cutout pattern, and the second power line may be connected to the third pixel substrate and disposed in the zigzag pattern that bypasses the first direction neighboring cutout pattern.

The third power line may be connected to the fourth pixel substrate and disposed in the zigzag pattern that bypasses the first direction neighboring cutout pattern, and the fourth power line may be connected to the third pixel substrate and disposed in the zigzag pattern that bypasses the first direction neighboring cutout pattern.

In an embodiment of the inventive concept, each of the first body part and the second body part may include at least four pixels disposed in, for example, at least a 2×2 matrix shape, and each of the at least four pixels may include a light-emitting element emitting light of a predetermined color. A person of ordinary skill in the art should understand and appreciate that if there are more than four pixels, (e.g., eight pixels), the matrix may be a 2×4 matrix shape, and if sixteen pixels, may be a 4×4 matrix shape.

A stretchable display device according to another exemplary embodiment of the inventive concept may include: a first pixel substrate; a second pixel substrate connected to the first pixel substrate in a first direction on a plane; a third pixel substrate connected to the second pixel substrate in a second direction on a plane; a fourth pixel substrate connected to the first pixel substrate in the second direction on a plane; a first direction neighboring cutout pattern disposed between the first pixel substrate and the fourth pixel substrate and between the second pixel substrate and the third pixel substrate; a second direction neighboring cutout pattern disposed between the first pixel substrate and the second pixel substrate and between the third pixel substrate and the fourth pixel substrate; a first power line disposed at the first pixel substrate and the fourth pixel substrate and applied with a first power voltage; and a second power line disposed at the second pixel substrate and the third pixel substrate and applied with the first power voltage, wherein the first power line and the second power line are disposed with a symmetrical structure based on a reference line extending corresponding to the second direction neighboring cutout pattern in the second direction.

The first direction may be perpendicular to the second direction.

The first power line and the second power line may be disposed in a zigzag pattern that bypasses the first direction neighboring cutout pattern.

The first power line and the second power line may be disposed at the same distance in the first direction based on the reference line.

A third power line may be disposed at the first pixel substrate and the fourth pixel substrate and applied with a second power voltage, and a fourth power line may be disposed at the second pixel substrate and the third pixel substrate and applied with the second power voltage may be further included, and the third power line and the fourth power line may be disposed with the symmetrical structure based on the reference line.

The third power line and the fourth power line may be disposed in the zigzag pattern that bypasses the first direction neighboring cutout pattern.

According to an embodiment of the inventive concept, a plurality of first pixel substrates and second pixel substrates each respectively connected one of a plurality of body parts and a respective one of a plurality of hinge parts, wherein the second direction neighboring cutout pattern extends between two or more first pixel substrates and second pixel substrates.

The third power line and the fourth power line may be disposed at about the same distance based on the reference line in the first direction A first data line may be disposed at the first pixel substrate and the fourth pixel substrate and applied with a first data voltage, and a second data line may be disposed at the second pixel substrate and the third pixel substrate and applied with a second data voltage may be further included, and the first data line and the second data line may be disposed with a symmetrical structure based on the reference line.

Although the resolution of the stretchable display device may be as high or higher than known handheld devices, the possibility of interference or a short may be minimized between the wires disposed at the adjacent hinge parts because of the structure of the display as shown and described herein. The stretchable display device according to embodiments of the inventive concept may provide a more reliable electrically functioning stretchable display device than known heretofore.

DETAILED DESCRIPTION OF THE EMBODIMENTS

Figure 1:
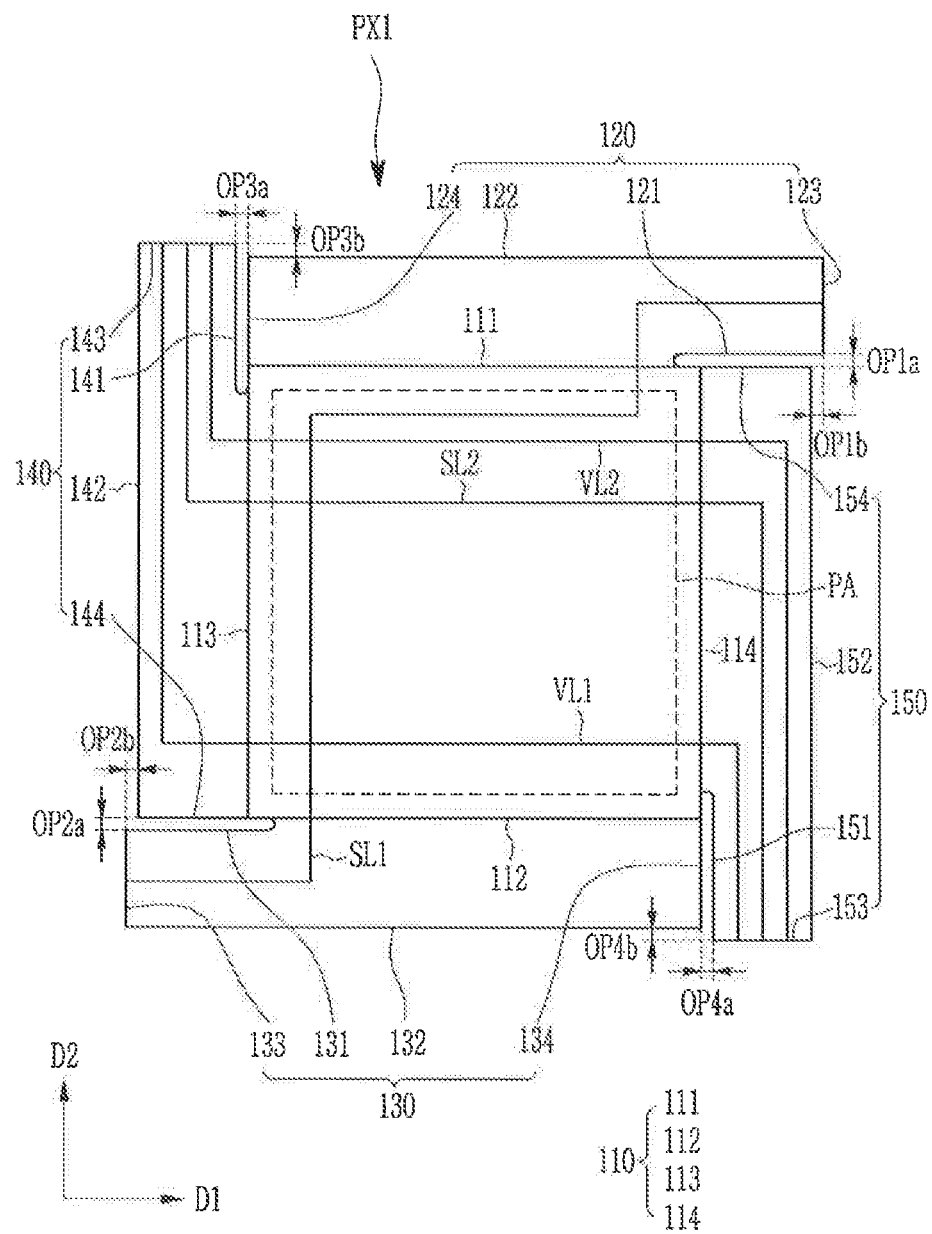
FIG. 1 is a plan view of a first pixel substrate included in a stretchable display device according to an exemplary embodiment of the inventive concept.

Embodiments of the inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the inventive concept and the appended claims Configurations and descriptions that are well-known may be omitted so as not to obscure an artisan's appreciation of the embodiments of the inventive concept, and like reference numerals may designate like elements throughout the specification.

The size and thickness of each component shown in the drawings may not be shown to scale for better understanding and ease of description, and the embodiments of the inventive concept is not limited to the drawings shown and described. In the drawings, the thickness of layers, films, panels, regions, etc., may be exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in this specification, the phrase "overlapping" refers to being vertically overlapped on a cross-section, or positioning all or a part in the same region on a plane.

A person of ordinary skill in the art should understand and appreciate that while the embodiments of the inventive concept and the appended claims are directed to a stretchable display device, the breadth of the embodiments of the inventive concept is not limited thereto, and is applicable, for example, to bendable display devices, rollable display devices, and foldable display devices, just to name some non-limiting examples. In other words, the embodiments of the inventive concept are applicable to any display device having a shape that is at least temporarily deformable/flexible.

Figure 3:
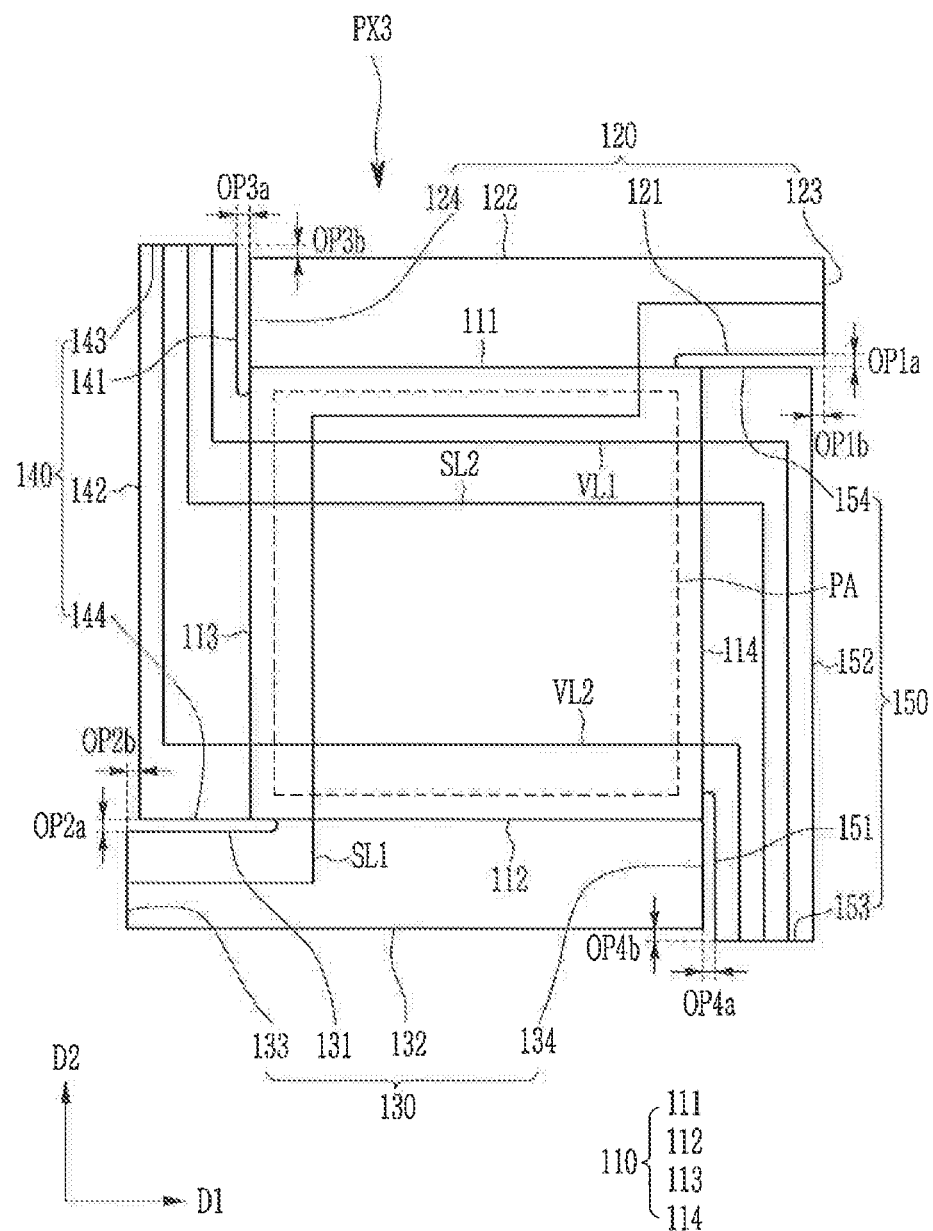
FIG. 3 is a plan view of a third pixel substrate included in a stretchable display device according to an exemplary embodiment of the inventive concept.
Figure 4:
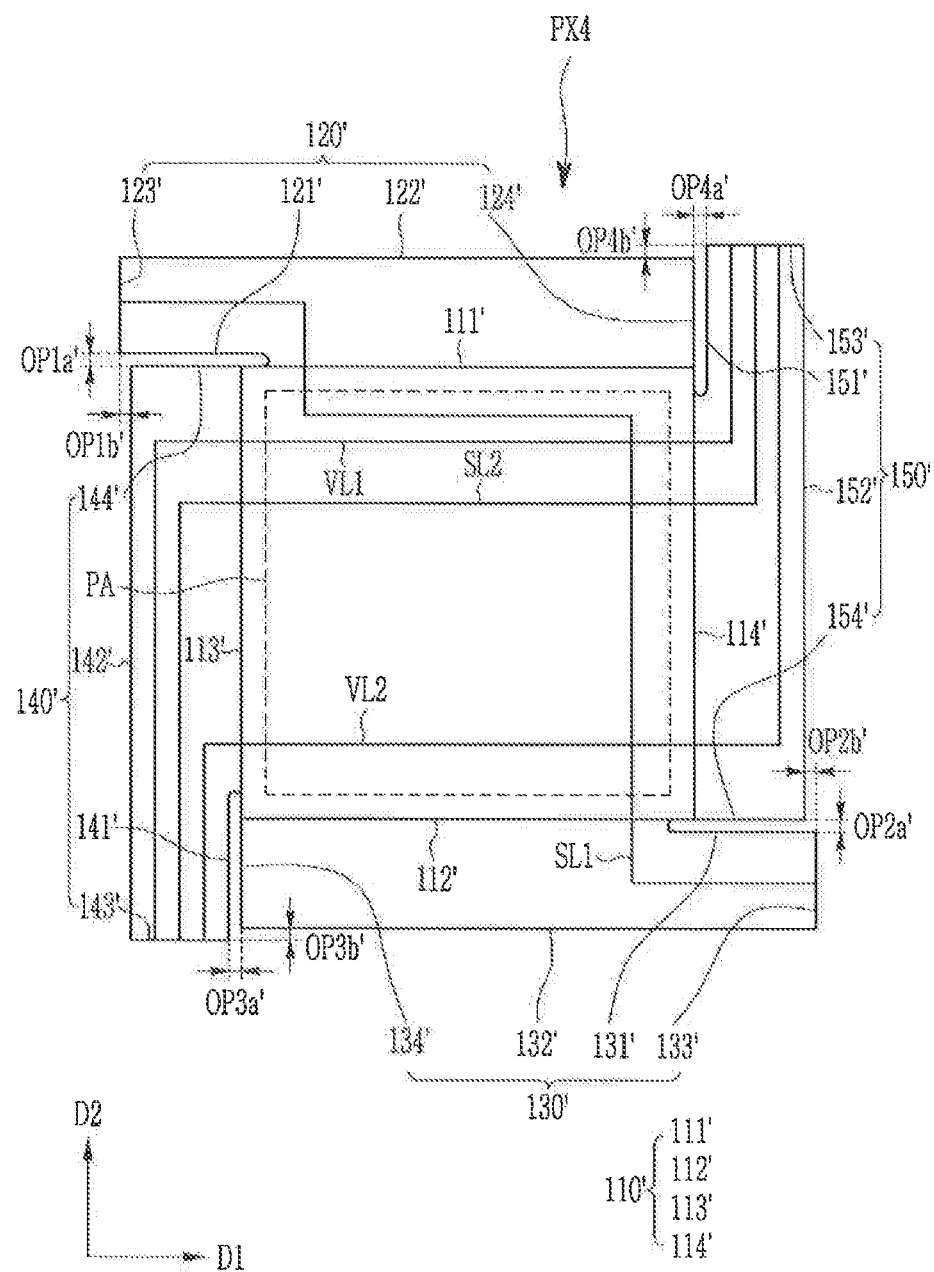
FIG. 4 is a plan view of a fourth pixel substrate included in a stretchable display device according to an exemplary embodiment of the inventive concept.

Now, the first to fourth pixel substrates included in a stretchable display device will be described with reference to FIG. 1, FIG. 2. FIG. 3 and FIG. 4, and the stretchable display device including the first to fourth pixel substrates will be described with reference to FIG. 5.

Figure 5:
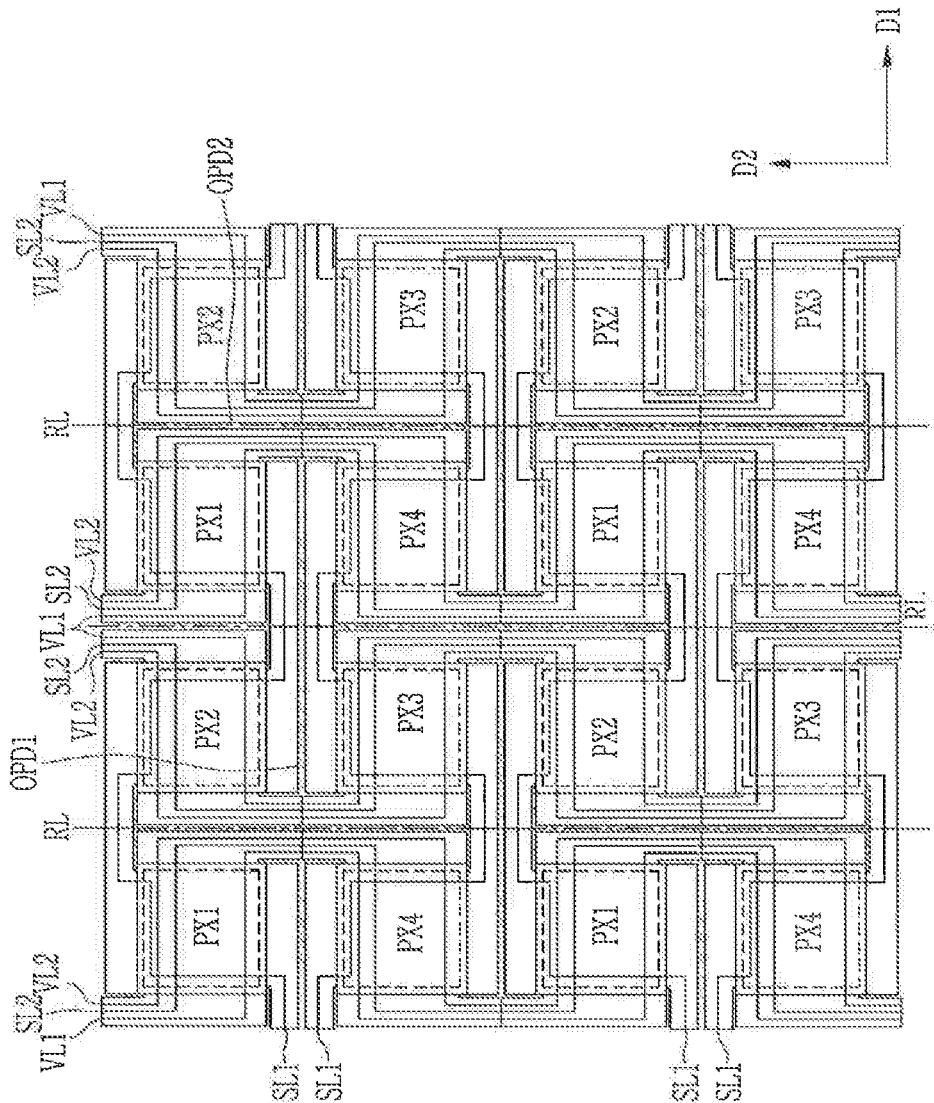
FIG. 5 is a plan view of a stretchable display device including a first pixel substrate, a second pixel substrate, a third pixel substrate, and a fourth pixel substrate.

FIG. 1 is a plan view of a first pixel substrate included in a stretchable display device according to an exemplary embodiment of the inventive concept. FIG. 2 is a plan view of a second pixel substrate included in a stretchable display device according to an exemplary embodiment of the inventive concept. FIG. 3 is a plan view of a third pixel substrate included in a stretchable display device according to an exemplary embodiment of the inventive concept. FIG. 4 is a plan view of a fourth pixel substrate included in a stretchable display device according to an exemplary embodiment of the inventive concept. FIG. 5 is a plan view of a stretchable display device including a first pixel substrate, a second pixel substrate, a third pixel substrate, and a fourth pixel substrate.

Referring now to FIG. 1, the first pixel substrate PX1 includes a first body part 110 (identified by dashed lines) and a plurality of hinge parts 120, 130, 140, and 150.

The first body part 110 may include a first side 111, a second side 112, a third side 113, and a fourth side 114. The first side 111 and the second side 112 are parallel to the first direction D1, and the first side 111 and the second side 112 may face each other. The third side 113 and the fourth side 114 are parallel to a second direction D2 crossing the first direction D1, and the third side 113 and the fourth side 114 may face each other. For example, the first body part 110 may have a substantially quadrangular shape including the first side 111, the second side 112, the third side 113, and the fourth side 114.

The first body part 110 may include a pixel area PA in which at least one light-emitting element (not shown) is disposed. For example, one light-emitting element emitting light from among one of red, green, and blue light may be disposed in the pixel area PA. Also, a red light-emitting element emitting red light, a green light-emitting element emitting green light, and a blue light-emitting element emitting blue light may be disposed in the pixel area PA. In addition, the red light-emitting element, the green light-emitting element, the blue light-emitting element, and a white light-emitting element emitting white light may be disposed in the pixel area PA. The number and the color of the light-emitting element disposed in the pixel area PA are not limited to the aforementioned combinations.

Hereinafter, with reference to the drawings, on a plane, a right direction represents one direction parallel to the first direction D1, and a left direction represents another direction parallel to the first direction D1. The right direction is an opposite direction of the left direction. Further, on a plane, an upper direction represents one direction parallel to the second direction D2, and a lower direction represents another direction parallel to the second direction D2. The upper direction is an opposite direction of the lower direction.

The first hinge part 120 is connected to the first side 111 of the first body part 110 and extends longer in the right direction than the first side 111 of the first body part 110. The second hinge part 130 is connected to the second side 112 of the first body part 110 and extends longer in the left direction than the second side 112 of the first body part 110. The third hinge part 140 is connected to the third side 113 of the first body part 110 and extends in the upper direction longer than the third side 113 of the first body part 110. The fourth hinge part 150 is connected to the fourth side 114 of the first body part 110 and extends longer in the lower direction than the fourth side 114 of the first body part 110.

The first hinge part 120 includes a first side 121, a second side 122, a third side 123, and a fourth side 124, and may have an approximate quadrangular shape. Part of the first side 121 of the first hinge part 120 overlaps the first side 111 of the first body part 110, and another part of the first side 121 of the first hinge part 120 is separated from an extending line of the first side 111 of the first body part 110 in the second direction D2 by a first cutout pattern OP1a. The first cutout pattern OP1a may be a pattern cut in the part of the first hinge part 120 in the first direction D1 between the first hinge part 120 and the fourth hinge part 150. The first cutout pattern OP1a may be a cut extending from the part of the first hinge part 120 to the part between the first hinge part 120 and the first body part 110.

The second hinge part 130 includes a first side 131, a second side 132, a third side 133, and a fourth side 134, and may have the approximate quadrangle shape. Part of the first side 131 of the second hinge part 130 overlaps the second side 112 of the first body part 110, and another part of the first side 131 of the second hinge part 130 is separated from the extending line of the second side 112 of the first body part 110 by a second cutout pattern OP2a in the second direction D2. The second cutout pattern OP2a may be the pattern cut in the part of the second hinge part 130 in the first direction D1 between the second hinge part 130 and the third hinge part 140. The second cutout pattern OP2a may be a cut extending from the part of the second hinge part 130 to the part between the second hinge part 130 and the first body part 110.

With continued reference to FIG. 1, the third hinge part 140 includes a first side 141, a second side 142, a third side 143, and a fourth side 144, and may have the approximate quadrangle shape. Part of the first side 141 of the third hinge part 140 overlaps the third side 113 of the first body part 110, and another part of the first side 141 of the third hinge part 140 is separated from the extending line of the third side 113 of the first body part 110 by the third cutout pattern OP3a in the first direction D1. The third cutout pattern OP3a may be the pattern cut in the part of the third hinge part 140 in the second direction D2 between the third hinge part 140 and the first hinge part 120. The third cutout pattern OP3a may be a cut extending from the part of the third hinge part 140 to the part between the third hinge part 140 and the first body part 110.

The fourth hinge part 150 includes a first side 151, a second side 152, a third side 153, and a fourth side 154, and may have the approximate quadrangle shape. Part of the first side 151 of the fourth hinge part 150 overlaps the fourth side 114 of the first body part 110, and another part of the first side 151 of the fourth hinge part 150 is separated from the extending line of the fourth side 114 of the first body part 110 by a fourth cutout pattern OP4a in the first direction D1. The fourth cutout pattern OP4a may be the pattern cut in the part of the fourth hinge part 150 in the second direction D2 between the fourth hinge part 150 and the second hinge part 130. The fourth cutout pattern OP4a may be a cut extending from the part of the fourth hinge part 150 to the part between the fourth hinge part 150 and the first body part 110.

The third side 123 of the first hinge part 120 may extend in the right direction longer than the second side 152 of the fourth hinge part 150 by a first separation pattern OP1b. The first separation pattern OP1b is disposed at the right of the fourth hinge part 150. The first separation pattern OP1b may form a second direction neighboring cutout pattern (referring to OPD2 of FIG. 5) disposed between the substrate adjacent to the right of the first pixel substrate PX1 and the first pixel substrate PX1. The second direction neighboring cutout pattern OPD2 may indicate the cutout pattern extending in the second direction D2 between two or more pixel substrates among the plurality of cutout patterns included in the stretchable display device.

A plurality of first power lines VL1 and the plurality of second power lines VL2 may be disposed with a symmetrical structure based on an imaginary reference line RL corresponding to the second direction neighboring cutout pattern OPD2. The plurality of first power lines VL1 or the plurality of second power lines VL2 may be disposed closest to each other via the second direction neighboring cutout pattern OPD2. The structure of this embodiment of the inventive concept may minimize interference or shorts between wires.

The third side 133 of the second hinge part 130 may extend in the left direction longer than the second side 142 of the third hinge part 140 by a second separation pattern OP2b. The second separation pattern OP2b is disposed at the left of the third hinge part 140. The second separation pattern OP2b may form the second direction neighboring cutout pattern OPD2 disposed between the substrate adjacent to the left of the first pixel substrate PX1 and the first pixel substrate PX1.

The third side 143 of the third hinge part 140 may extend in the upper direction longer than the second side 122 of the first hinge part 120 by a third separation pattern OP3b. The third separation pattern OP3b is disposed at the upper side of the first hinge part 120. The third separation pattern OP3b may form a first direction neighboring cutout pattern (referring to OPD1 of FIG. 5) disposed between the substrate adjacent to the upper side of the first pixel substrate PX1 and the first pixel substrate PX1. The first direction neighboring cutout pattern OPD1 may indicate the cutout pattern extending in the first direction D1 between two or more pixel substrates among the plurality of cutout patterns included in the stretchable display device.

The third side 153 of the fourth hinge part 150 may extend in the lower direction longer than the second side 132 of the second hinge part 130 by a fourth separation pattern OP4b. The fourth separation pattern OP4b is disposed at the lower side of the second hinge part 130. The fourth separation pattern OP4b may form the first direction neighboring cutout pattern OPD1 disposed between the substrate adjacent to the lower side of the first pixel substrate PX1 and the first pixel substrate PX1.

Signal lines SL1 and SL2 and power lines VL1 and VL2 to drive the pixel may be disposed at the first body part 110 and the plurality of hinge parts 120, 130, 140, and 150.

The first signal line SL1 may include one end disposed at the third side 133 of the second hinge part 130 and the other end disposed at the third side 123 of the first hinge part 120. The first signal line SL1 may extend to the first body part 110 by bypassing the first cutout pattern OP1a and being bent at the first hinge part 120. Also, the first signal line SL1 may extend to the first body part 110 by bypassing the second cutout pattern OP2a and being bent at the second hinge part 130.

The second signal line SL2 may include one end disposed at the third side 143 of the third hinge part 140 and the other end disposed at the third side 153 of the fourth hinge part 150. The second signal line SL2 may be extended to the first body part 110 by bypassing the third cutout pattern OP3a and being bent at the third hinge part 140. Also, the second signal line SL2 may be extended to the first body part 110 by bypassing the fourth cutout pattern OP4a and being bent at the fourth hinge part 150.

The first power line VL1 may include one end disposed at the third side 143 of the third hinge part 140 and the other end disposed at the third side 153 of the fourth hinge part 150. The first power line VL1 may be extended to the first body part 110 by bypassing the third cutout pattern OP3a and being bent at the third hinge part 140. Also, the first power line VL1 may be extended to the first body part 110 to bypass the fourth cutout pattern OP4a and being bent at the fourth hinge part 150. A first power voltage may be applied to the first power line VL1.

The second power line VL2 may include one end disposed at the third side 143 of the third hinge part 140 and the other end disposed at the third side 153 of the fourth hinge part 150. The second power line VL2 may be extended to the first body part 110 by bypassing the third cutout pattern OP3a and being bent at the third hinge part 140. Also, the second power line VL2 may be extended to the first body part 110 by bypassing the fourth cutout pattern OP4a and being bent at the fourth hinge part 150. A second power voltage may be applied to the second power line VL2.

A first power line VL1, a second signal line SL2, and a second power line VL2 are disposed at the third hinge part 140, the first power line VL1 may be disposed closest to the second side 142 of the third hinge part 140, and the second power line VL2 may be disposed closest to the first side 141 of the third hinge part 140. For example, the first power line VL1 may be disposed furthest outside the pixel area PA at the third hinge part 140. The second signal line SL2 may be disposed between the first power line VL1 and the second power line VL2.

A first power line VL1, a second signal line SL2, and a second power line VL2 are disposed at the fourth hinge part 150, the first power line VL1 may be disposed closest to the first side 151 of the fourth hinge part 150, and the second power line VL2 may be disposed closest to the second side 152 of the fourth hinge part 150. For example, the second power line VL2 may be disposed furthest outside the pixel area PA at the fourth hinge part 150. The second signal line SL2 may be disposed between the first power line VL1 and the second power line VL2.

The first body part 110 and the first hinge part 120, second hinge part 130, third hinge part 140 and fourth hinge part 150 may include in their construction a polyester such as polyethylene terephthalate, polybutylene phthalate, polyethylene naphthalate, etc. Also, the first body part 110 and the first to fourth hinge parts 120, 130, 140, and 150 include a polymer, e.g., a polystyrene, polycarbonate, polyether sulfone, polyarylate, polyimide, polycycloolefin, norbornene resin, poly (chlorotrifluoroethylene), polymethyl methacrylate, etc.

Figure 2:
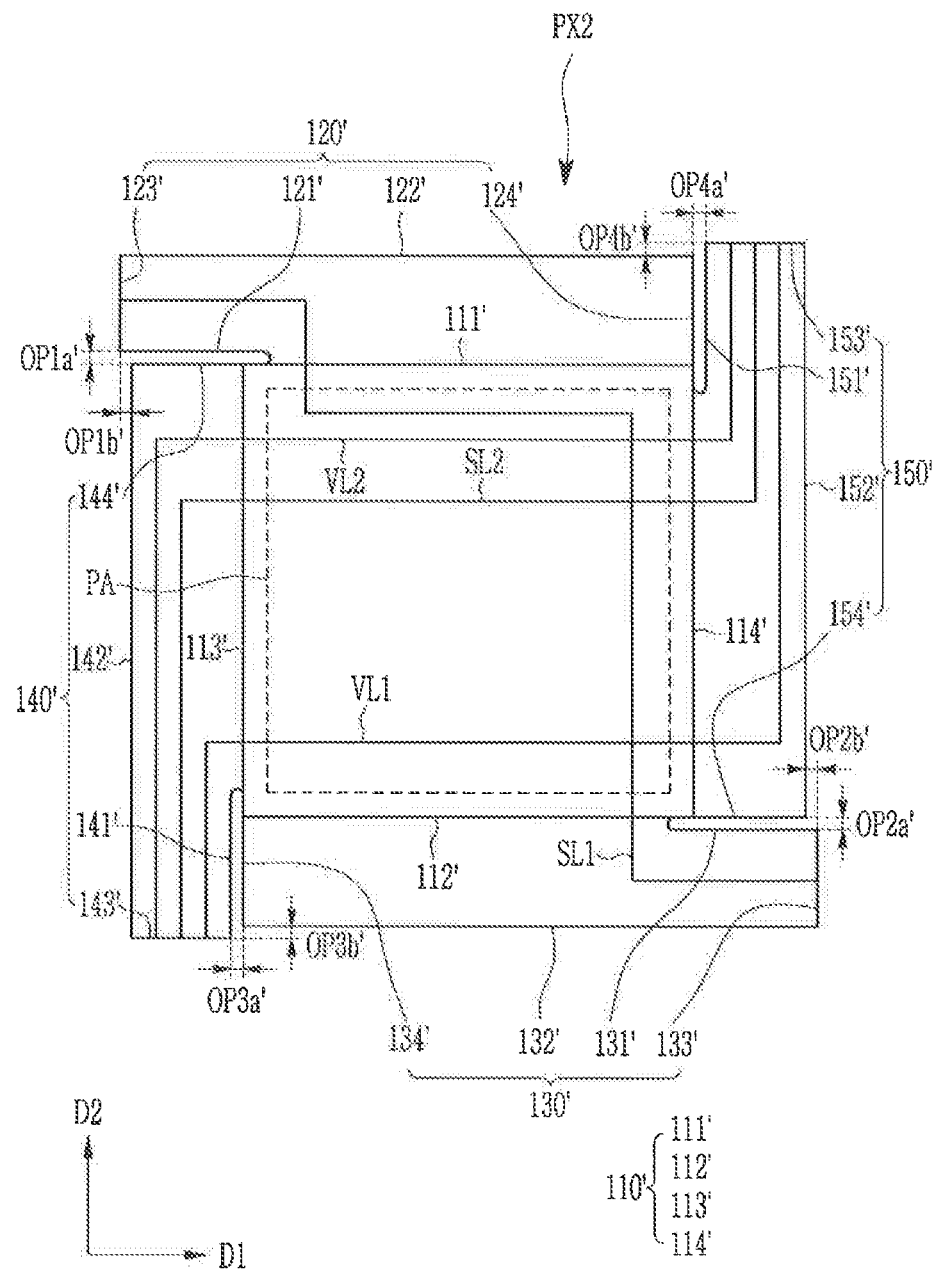
FIG. 2 is a plan view of a second pixel substrate included in a stretchable display device according to an exemplary embodiment of the inventive concept.

Next, referring to FIG. 2, the second pixel substrate PX2 includes a second body part 110' and a plurality of hinge parts 120', 130', 140', and 150'.

The second body part 110' may include a first side 111', a second side 112', a third side 113', and a fourth side 114'. The first side 111' and the second side 112' may be parallel to the first direction D1, and the first side 111' and the second side 112' may face each other. The third side 113' and the fourth side 114' may be parallel to the second direction D2, and the third side 113' and the fourth side 114' may face each other. For example, the second body part 110' may have the quadrangular shape formed of the first side 111', the second side 112', the third side 113', and the fourth side 114'.

The second body part 110' may include the pixel area PA in which at least one light-emitting element (not shown) is disposed. The pixel area PA may include at least one light-emitting element as shown in FIG. 1.

The fifth hinge part 120' is connected to the first side 111' of the second body part 110', and extends longer in the left direction than the first side 111' of the second body part 110'. The sixth hinge part 130' is connected to the second side 112' of the second body part 110', and extends longer in the right direction than the second side 112' of the second body part 110.' The seventh hinge part 140' is connected to the third side 113' of the second body part 110', and extends longer in the lower direction than the third side 113' of the second body part 110'. The eighth hinge part 150' is connected to the fourth side 114' of the second body part 110', and extends longer in the upper direction than the fourth side 114' of the second body part 110'.

The fifth hinge part 120' includes a first side 121', a second side 122', a third side 123', and a fourth side 124', and may have the approximate quadrangular shape. Part of the first side 121' of the fifth hinge part 120' overlaps the first side 111' of the second body part 110', and another part of the first side 121' of the fifth hinge part 120' is separated from the extending line of the first side 111' of the second body part 110' by the fifth cutout pattern OP1a' in the second direction D2. The fifth cutout pattern OP1a' may be the pattern cut in the part of the fifth hinge part 120' in the first direction D1 between the fifth hinge part 120' and the seventh hinge part 140'. The fifth cutout pattern OP1a' may be a cut extending from the part of the fifth hinge part 120' to the part between the fifth hinge part 120' and the second body part 110'.

The sixth hinge part 130' may include a first side 131', a second side 132', a third side 133', and a fourth side 134', and may have the approximate quadrangle shape. Part of the first side 131' of the sixth hinge part 130' overlaps the second side 112' of the second body part 110', and another part of the first side 131' of the sixth hinge part 130' is separated from the extending line of the second side 112' of the second body part 110' by the sixth cutout pattern OP2a' in the second direction D2. The sixth cutout pattern OP2a' may be the pattern cut in the part of the sixth hinge part 130' between the sixth hinge part 130' and the eighth hinge part 150' in the first direction D1. The sixth cutout pattern OP2a' may be a cut extending from the part of the sixth hinge part 130' to the part between the sixth hinge part 130' and the second body part 110'.

The seventh hinge part 140' includes a first side 141', a second side 142', a third side 143', and a fourth side 144', and may have the approximate quadrangle shape. Part of the first side 141' of the seventh hinge part 140' overlaps the third side 113' of the second body part 110', and another part of the first side 141' of the seventh hinge part 140' is separated from the extending line of the third side 113' of the second body part 110' by the seventh cutout pattern OP3a' in the first direction D1. The seventh cutout pattern OP3a' may be the pattern cut in the part of the seventh hinge part 140' between the seventh hinge part 140' and the sixth hinge part 130' in the second direction D2. The seventh cutout pattern OP3a' may be a cut extending from the part of the seventh hinge part 140' to the part between the seventh hinge part 140' and the second body part 110'.

The eighth hinge part 150' includes a first side 151', a second side 152', a third side 153', and a fourth side 154', and may have the approximate quadrangle shape. Part of the first side 151' of the eighth hinge part 150' overlaps the fourth side 114' of the second body part 110', and another part of the first side 151' of the eighth hinge part 150' is separated from the extending line of the fourth side 114' of the second body part 110' by the eighth cutout pattern OP4a' in the first direction D1. The eighth cutout pattern OP4a' may be the pattern cut in the part of the eighth hinge part 150' in the second direction D2 between the eighth hinge part 150' and the fifth hinge part 120'. The eighth cutout pattern OP4a' may be cut extending from the part of the eighth hinge part 150' to the part between the eighth hinge part 150' and the second body part 110'.

The third side 123' of the fifth hinge part 120' may be extended to be longer than the second side 142' of the seventh hinge part 140' in the left direction by a fifth separation pattern OP1b'. The fifth separation pattern OP1b' is disposed at the left of the seventh hinge part 140'. The fifth separation pattern OP1b' may form a second direction neighboring cutout pattern OPD2 disposed between the substrate disposed at the left of the second pixel substrate PX2 and the second pixel substrate PX2.

The third side 133' of the sixth hinge part 130' may be extended to be longer in the right direction than the second side 152' of the eighth hinge part 150' by a sixth separation pattern OP2b'. The sixth separation pattern OP2b' is disposed at the right of the eighth hinge part 150'. The sixth separation pattern OP2b' may form the second direction neighboring cutout pattern OPD2 (FIG. 5) disposed between the substrate adjacent to the right of the second pixel substrate PX2 and the second pixel substrate PX2.

The third side 143' of the seventh hinge part 140' may be extended longer in the lower direction than the second side 132' of the sixth hinge part 130' by a seventh separation pattern OP3b'. The seventh separation pattern OP3b' is disposed at the lower side of the sixth hinge part 130'. The seventh separation pattern OP3b' may form the first direction neighboring cutout pattern OPD1 disposed between the substrate adjacent to the lower side of the second pixel substrate PX2 and the second pixel substrate PX2.

The third side 153' of the eighth hinge part 150' may be extended longer in the upper direction than the second side 122' of the fifth hinge part 120' by an eighth separation pattern OP4b'. The eighth separation pattern OP4b' is disposed at the upper side of the fifth hinge part 120'. The eighth separation pattern OP4b' may form the first direction neighboring cutout pattern OPD1 disposed between the substrate adjacent to the upper side of the second pixel substrate PX2 and the second pixel substrate PX2.

The signal lines SL1 and SL2 and the power lines VL1 and VL2 to drive the pixel may be disposed at the second body part 110' and the plurality of hinge parts 120', 130', 140', and 150'.

The first signal line SL1 may include one end disposed at the third side 123' of the fifth hinge part 120' and the other end disposed at the third side 133' of the sixth hinge part 130'. The first signal line SL1 may be extended to the second body part 110' by bypassing the fifth cutout pattern OP1a' and being bent at the fifth hinge part 120'. Also, the first signal line SL1 may be extended to the first body part 110 by bypassing the sixth cutout pattern OP2a' and being bent at the sixth hinge part 130'.

The second signal line SL2 may include one end disposed at the third side 143' of the seventh hinge part 140' and the other end disposed at the third side 153' of the eighth hinge part 150'. The second signal fine SL2 may be extended to the second body part 110' by bypassing the seventh cutout pattern OP3a' and being bent at the seventh hinge part 140'. Also, the second signal line SL2 may be extended to the second body part 110' by bypassing the eighth cutout pattern OP4a' and being bent at the eighth hinge part 150'.

The first power line VL1 may include one end disposed at the third side 143' of the seventh hinge part 140' and the other end disposed at the third side 153' of the eighth hinge part 150'. The first power line VL1 may be extended to the second body part 110' by bypassing the seventh cutout pattern OP3a' and being bent at the seventh hinge part 140'. Also, the first power line VL1 may be extended to the second body part 110' by bypassing the eighth cutout pattern OP4a' and being bent at the eighth hinge part 150'.

The second power line VL2 may include one end disposed at the third side 143' of the seventh hinge part 140' and the other end disposed at the third side 153 of the eighth hinge part 150'. The second power line VL2 may be extended to the second body part 110' by bypassing the seventh cutout pattern OP3a' and being bent at the seventh hinge part 140'. Also, the second power line VL2 may be extended to the second body part 110' by bypassing the eighth cutout pattern OP4a' and being bent at the eighth hinge part 150'.

The first power line VL1, the second signal line SL2, and the second power line VL2 are disposed at the seventh hinge part 140', the first power line VL1 may be disposed closest to the first side 141' of the seventh hinge part 140', and the second power line VL2 may be disposed closest to the second side 142' of the seventh hinge part 140'. For example, the second power line VL2 may be disposed furthest outside the pixel area PA at the seventh hinge part 140'. The second signal line SL2 may be disposed between the first power line VL1 and the second power line VL2.

The first power line VL1, the second signal line SL2, and the second power line VL2 are disposed at the eighth hinge part 150', the first power line VL1 may be disposed closest to the second side 152' of the eighth hinge part 150', and the second power line VL2 may be disposed closest to the first side 151' of the eighth hinge part 150'. For example, the first power line VL1 may be disposed furthest outside the pixel area PA at the eighth hinge part 150'. The second signal line SL2 may be disposed between the first power line VL1 and the second power line VL2.

The second body part 110' and the fifth to eighth hinge parts 120', 130', 140', and 150' may have a construction including a polyester or a polymer.

Next, the third pixel substrate PX3 will be described with reference to FIG. 3. To avoid repetitive descriptions of the drawings, differences between the third pixel substrate PX3 when compared with the first pixel substrate PX1 of FIG. 1 will be mainly described.

At the third hinge part 140 of the third pixel substrate PX3, the first power line VL1 may be disposed closest to the first side 141 of the third hinge part 140, and the second power line VL2 may be disposed closest to the second side 142 of the third hinge part 140. Also, at the fourth hinge part 150 of the third pixel substrate PX3, the first power line VL1 may be disposed closest to the second side 152 of the fourth hinge part 150, and the second power line VL2 may be disposed closest to the first side 151 of the fourth hinge part 150. For example, the first power line VL1 of the third pixel substrate PX3 may be disposed furthest outside the pixel area PA of the third pixel substrate PX3 at the fourth hinge part 150. Also, the second power line VL2 of the third pixel substrate PX3 may be disposed furthest outside the pixel area PA of the third pixel substrate PX3 at the third hinge part 140. In other words, at the third pixel substrate PX3 of FIG. 3, the position of the first power line VL1 and the second power line VL2 is opposite to the position of the first power line VL1 and the second power line VL2 at the first pixel substrate PX1 of FIG. 1.

Except for the differences described in the preceding paragraph, the description of the first pixel substrate PX1 in the exemplary embodiment of FIG. 1 may be applied to the third pixel substrate PX3 of the exemplary embodiment of FIG. 3.

Next, the fourth pixel substrate PX4 will be described with reference to FIG. 4. Differences of the fourth pixel substrate PX4 compared with the second pixel substrate PX2 of FIG. 2 will be mainly described hereinbelow.

At the seventh hinge part 140 of the 'fourth pixel substrate PX4, the first power line VL1 may be disposed closest to the second side 142' of the seventh hinge part 140', and the second power line VL2 may be disposed closest to the first side 141' of the seventh hinge part 140'. Also, at the eighth hinge part 150' of the fourth pixel substrate PX4, the first power line VL1 may be disposed closest to the first side 151' of the eighth hinge part 150', and the second power line VL2 may be disposed closest to the second side 152' of the eighth hinge part 150'. For example, the first power line VL1 of the fourth pixel substrate PX4 may be disposed furthest outside the pixel area PA of the fourth pixel substrate PX4 at the seventh hinge part 140'. Also, the second power line VL2 of the fourth pixel substrate PX4 may be disposed furthest outside the pixel area PA of the fourth pixel substrate PX4 at the eighth hinge part 150'. In other words, the position of the first power line VL1 and the second power line VL2 at the fourth pixel substrate PX4 of FIG. 4 is opposite to the position of the first power line VL1 and the second power line VL2 at the second pixel substrate PX2 of FIG. 2.

Except for the differences described in the preceding paragraph, the characteristics of the second pixel substrate PX2 described in the exemplary embodiment of FIG. 2 may be applied to the fourth pixel substrate PX4 of the exemplary embodiment of FIG. 4. Next, the stretchable display device including the first pixel substrate PX1, the second pixel substrate PX2, the third pixel substrate PX3, and the fourth pixel substrate PX4 will be described with reference to FIG. 1 to FIG. 5.

With reference to FIG. 5, a person of ordinary skill in the art should understand and appreciate that the second pixel substrate PX2 is disposed at the right direction and the left direction of the first pixel substrate PX1 (see rows 1 and 3 in FIG. 5). Also, the fourth pixel substrate PX4 is disposed at the upper direction and the lower direction of the first pixel substrate PX1. The third pixel substrate PX3 is disposed at the upper direction and the lower direction of the second pixel substrate PX2. The third pixel substrate PX3 is disposed at both the right direction and at the left direction of the fourth pixel substrate PX4.

The third side 123 of the first hinge part 120 of the first pixel substrate PX1 overlaps the third side 123' of the fifth hinge part 120' of the second pixel substrate PX2 adjacent in the right direction, and the first hinge part 120 of the first pixel substrate PX1 and the fifth hinge part 120' of the second pixel substrate PX2 may be connected to each other. For example, the first pixel substrate PX1 and the second pixel substrate PX2 may be connected to each other through the first hinge part 120 and the fifth hinge part 120'. In this case, the first separation pattern OP1b and the fifth separation pattern OP1b' may be disposed between the first pixel substrate PX1 and the second pixel substrate PX2, and the first separation pattern OP1b and the fifth separation pattern OP1b' may form one second direction neighboring cutout pattern OPD2.

The third side 133 of the second hinge part 130 of the first pixel substrate PX1 may overlap the third side 133' of the sixth hinge part 130' of the second pixel substrate PX2 adjacent in the left direction, and the second hinge part 130 of the first pixel substrate PX1 and the sixth hinge part 130' of the second pixel substrate PX2 may be connected to each other. For example, the first pixel substrate PX1 and the second pixel substrate PX2 may be connected to each other through the second hinge part 130 and the sixth hinge part 130'. In this case, the second separation pattern OP2b and the sixth separation pattern OP2b' may be disposed between the first pixel substrate PX1 and the second pixel substrate PX2, and the second separation pattern OP2b and the sixth separation pattern OP2b' may formed between another second direction neighboring cutout pattern OPD2.

The third side 143 of the third hinge part 140 of the first pixel substrate PX1 may overlap the third side 143' of the seventh hinge part 140' of the fourth pixel substrate PX4 adjacent in the upper direction, and the third hinge part 140 of the first pixel substrate PX1 and the seventh hinge part 140' of the fourth pixel substrate PX4 may be connected to each other. For example, the first pixel substrate PX1 and the fourth pixel substrate PX4 may be connected through the third hinge part 140 and the seventh hinge part 140'. In this case, the third separation pattern OP3b and the seventh separation pattern OP3b' may be disposed between the first pixel substrate PX1 and the fourth pixel substrate PX4, and the third separation pattern OP3b and the seventh separation pattern OP3b' may form the first direction neighboring cutout pattern OPD1.

In addition, the third side 153 of the fourth hinge part 150 of the first pixel substrate PX1 may overlap the third side 153' of the eighth hinge part 150' of the fourth pixel substrate PX4 adjacent in the lower direction, and the fourth hinge part 150 of the first pixel substrate PX1 and the eighth hinge part 150' of the fourth pixel substrate PX4 may be connected to each other. For example, the first pixel substrate PX1 and the fourth pixel substrate PX4 may be connected to each other through the fourth hinge part 150 and the eighth hinge part 150'. In this case, the fourth separation pattern OP4b and the eighth separation pattern OP4b' may be disposed between the first pixel substrate PX1 and the fourth pixel substrate PX4, and the fourth separation pattern OP4b and the eighth separation pattern OP4b' may form another first direction neighboring cutout pattern OPD1.

According to this embodiment of the inventive concept, the first pixel substrate PX1 may be connected to the second pixel substrate PX2 adjacent in the right direction and the left direction, and the first pixel substrate PX1 may be connected to the fourth pixel substrate PX4 adjacent in the upper direction and the lower direction.

The third pixel substrate PX3 has the same structure as the first pixel substrate PX1 except for the position of the first and second power lines VL1 and VL2, and the second pixel substrate PX2 has the same structure as the fourth pixel substrate PX4 except for the position of the first and second power lines VL1 and VL2. Accordingly, by the same method as the connection method of the first pixel substrate PX1, the third pixel substrate PX3 may be connected to the fourth pixel substrate PX4 adjacent in the right direction and the left direction, and the third pixel substrate PX3 may be connected to the second pixel substrate PX2 adjacent in the upper direction and the lower direction. The detailed description thereof is thus omitted.

As described above, when the first pixel substrate PX1, the second pixel substrate PX2, the third pixel substrate PX3, and the fourth pixel substrate PX4 are connected to each other, as exemplified in FIG. 5, the first power line VL1 of the first pixel substrate PX1 and the first power line VL1 of the fourth pixel substrate PX4 may be connected to each other, the second power line VL2 of the first pixel substrate PX1 and the second power line VL2 of the fourth pixel substrate PX4 may be connected to each other, and the second signal line SL2 of the first pixel substrate PX1 and the second signal line SL2 of the fourth pixel substrate PX4 may be connected to each other. Also, the first power line VL1 of the second pixel substrate PX2 and the first power line VL1 of the third pixel substrate PX3 may be connected to each other, the second power line VL2 of the second pixel substrate PX2 and the second power line VL2 of the third pixel substrate PX3 may be connected to each other, and the second signal line SL2 of the second pixel substrate PX2 and the second signal line SL2 of the third pixel substrate PX3 may be connected to each other. Also, the first signal line SL1 of the first pixel substrate PX1 and the first signal line SL1 of the second pixel substrate PX2 may be connected to each other, and the first signal line SL1 of the third pixel substrate PX3 and the first signal line SL1 of the fourth pixel substrate PX4 may be connected to each other.

For example, the second direction neighboring cutout pattern OPD2 may be disposed to be extended in the second direction D2 between the first pixel substrate PX1 and the second pixel substrate PX2 and between the third pixel substrate PX3 and the fourth pixel substrate PX4, and the plurality of first signal lines SL1 may be extended in the first direction D1 that bypasses the second direction neighboring cutout pattern OPD2. The plurality of first signal lines SL1 may be disposed with a zigzag pattern to bypass the second direction neighboring cutout pattern OPD2.

Also, the first direction neighboring cutout pattern OPD1 may be disposed to be extended in the first direction D1 between the first pixel substrate PX1 and the fourth pixel substrate PX4 and between the second pixel substrate PX2 and the third pixel substrate PX3, and the plurality of second signal lines SL2, the plurality of first power lines VL1, and the plurality of second power lines VL2 may be extended in the second direction D2 that bypasses the first direction neighboring cutout pattern OPD1. The plurality of second signal lines SL2, the plurality of first power lines VL1, and the plurality of second power lines VL2 may be disposed with the zigzag pattern to bypass the first direction neighboring cutout pattern OPD1.

The plurality of first power lines VL1 and the plurality of second power lines VL2 may have a symmetrical structure based on an imaginary reference line RL extending corresponding to the second direction neighboring cutout pattern OPD2 in the second direction D2. For, the first power line VL1 disposed at the right direction based on the reference line RL and the first power line VL1 disposed at the left direction may be disposed at substantially equal distances in the first direction D1. A person of ordinary skill in the art should understand and appreciate that the term "substantially equal distances" may not be identical distances. Due to variations and tolerances in the construction process, the distances may not be exactly the same, and thus may be substantially equal (e.g., in one non-limiting embodiment, there may be less than a 1% variation in the distances, and e.g., in another non-limiting embodiment, there may be less than a 5% variation in this distances). Also, the second power line VL2 disposed at the right direction based on the reference line RL and the second power line VL2 disposed at the left direction may be disposed at equal distances in the first direction D1.

For example, the first power line VL1 disposed closest to the second side 142 of the third hinge part 140 of the first pixel substrate PX1 and the first power line VL1 disposed closest to the second side 152' of the eighth hinge part 150' of the second pixel substrate PX2 may face each other via the second direction neighboring cutout pattern OPD2 and may be disposed symmetrically based on the imaginary reference line RL. Likewise, the second power line VL2 disposed closest to the second side 142 of the third hinge part 140 of the third pixel substrate PX3 and the second power line VL2 disposed closest to the second side 152' of the eighth hinge part 150' of the fourth pixel substrate PX4 may face each other via the second direction neighboring cutout pattern OPD2 and may be disposed symmetrically based on the imaginary reference line RL.

Also, the second power line VL2 disposed closest to the second side 152 of the fourth hinge part 150 of the first pixel substrate PX1 and the second power line VL2 disposed closest to the second side 142' of the seventh hinge part 140' of the second pixel substrate PX2 may face each other via the second direction neighboring cutout pattern OPD2 and may be disposed symmetrically based on the imaginary reference line RL. Likewise, the first power line VL1 disposed closest to the second side 152 of the fourth hinge part 150 of the third pixel substrate PX3 and the first power line VL1 disposed closest to the second side 142' of the seventh hinge part 140' of the fourth pixel substrate PX4 may face each other via the second direction neighboring cutout pattern OPD2 and may be disposed symmetrically based on the imaginary reference line RL.

On the other hand, when the stretchable display device is extended by an external force, while the part among the plurality of hinge parts 120, 130, 140, 150, 120', 130', 140', and 150' is twisted, the contact may be generated between the hinge parts 120, 130, 140, 150, 120', 130', 140', and 150' adjacent via the first direction neighboring cutout pattern OPD1 or the second direction neighboring cutout pattern OPD2. Particularly, the contact may be generated between the wires facing via the second direction neighboring cutout pattern OPD2 and disposed closest to each other.

In the above-described exemplary embodiment, as the plurality of first power lines VL1 and the plurality of second power lines VL2 are disposed with the symmetrical structure based on the imaginary reference line RL corresponding to the second direction neighboring cutout pattern OPD2, the first power lines VL1 or the second power line VL2 may be disposed closest to each other via the second direction neighboring cutout pattern OPD2. For example, the first power line VL1 may be disposed closer to the reference line RL than the second power line VL2 with respect to the reference line RL corresponding to the second direction neighboring cutout pattern OPD2. Also, the second power line VL2 may be disposed closer to the reference line RL than the first power line VL1 with respect to the reference line RL corresponding to the second direction neighboring cutout pattern OPD2 adjacent in the first direction D1.

Since the same first power voltage is applied to the plurality of first power lines VL1, even if the contact is generated to have a short between the first power lines VL1 disposed closest to each other via the second direction neighboring cutout pattern OPD2, since it is a short between the first power lines VL1 to which the same first power voltage is applied, the driving of the stretchable display device is not affected and the stretchable display device may be operated normally.

Also, since the same second power voltage is applied to the plurality of second power lines VL2, even if a contact is generated to have a short between the second power lines VL2 disposed closest to each other via the second direction neighboring cutout pattern OPD2, since it is a short between the second power lines VL2 to which the same second power voltage is applied, the driving of the stretchable display device is not affected and the stretchable display device may be operated normally.

On the other hand, as the resolution of the stretchable display device is high, many pixels may be disposed between the first body part 110 and the second body part 110', and many wires may be disposed at the plurality of hinge parts 120, 130, 140, 150, 120', 130', 140', and 150' to drive the many pixels. Even in such a case, the plurality of first power lines VL1 and the plurality of second power lines VL2 are disposed with the symmetrical structure based on the imaginary reference line RL corresponding to the second direction neighboring cutout pattern OPD2, thereby minimizing the interference or the short between the wires.

Next, an exemplary embodiment in which four pixels are disposed at the first body part 110 and the second body part 110' will be described with reference to FIG. 6 to FIG. 9. The overlapping description for the above-described contents in FIG. 1 to FIG. 5 is omitted, and differences are mainly described compared with FIG. 1 to FIG. 5. Also, the overlapping description is omitted in the exemplary embodiment of FIG. 6 to FIG. 9, and differences are mainly described.

Figure 6:
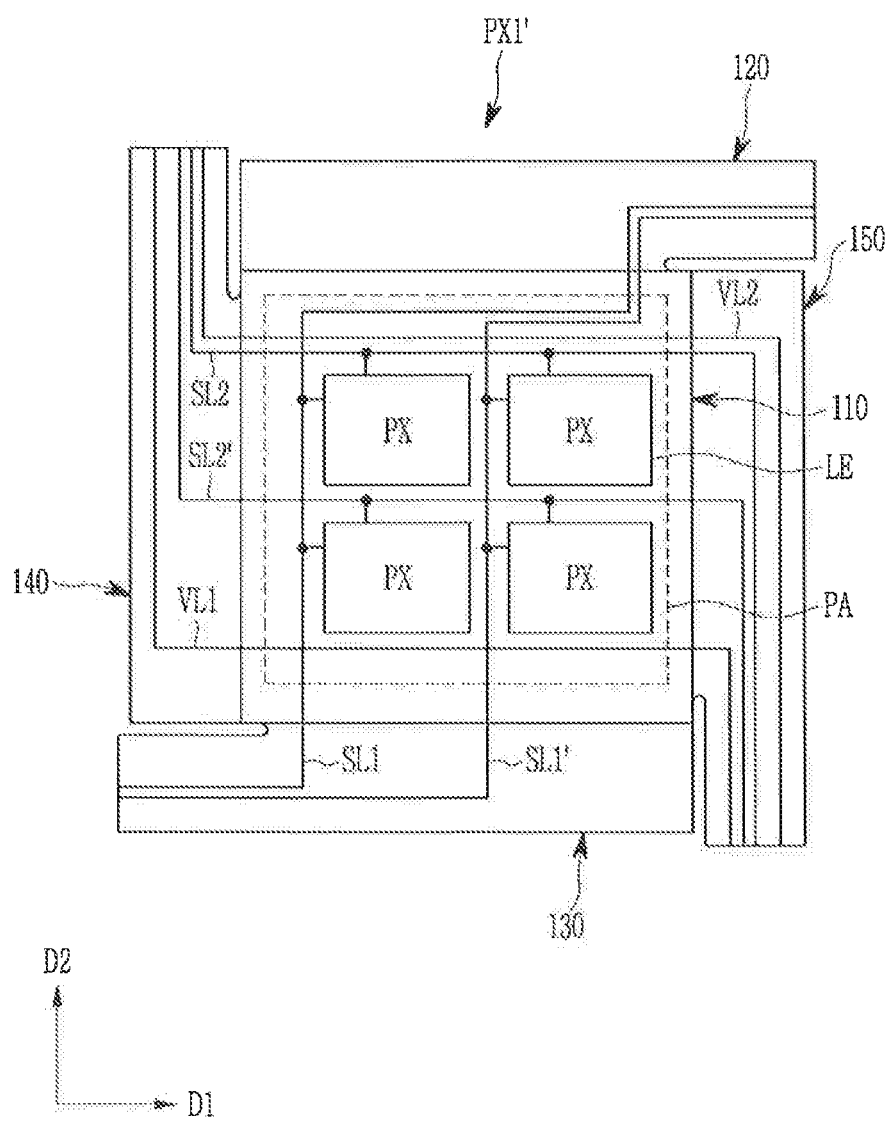
FIG. 6 is a plan view of a first pixel substrate included in a stretchable display device according to another exemplary embodiment of the inventive concept.
Figure 7:
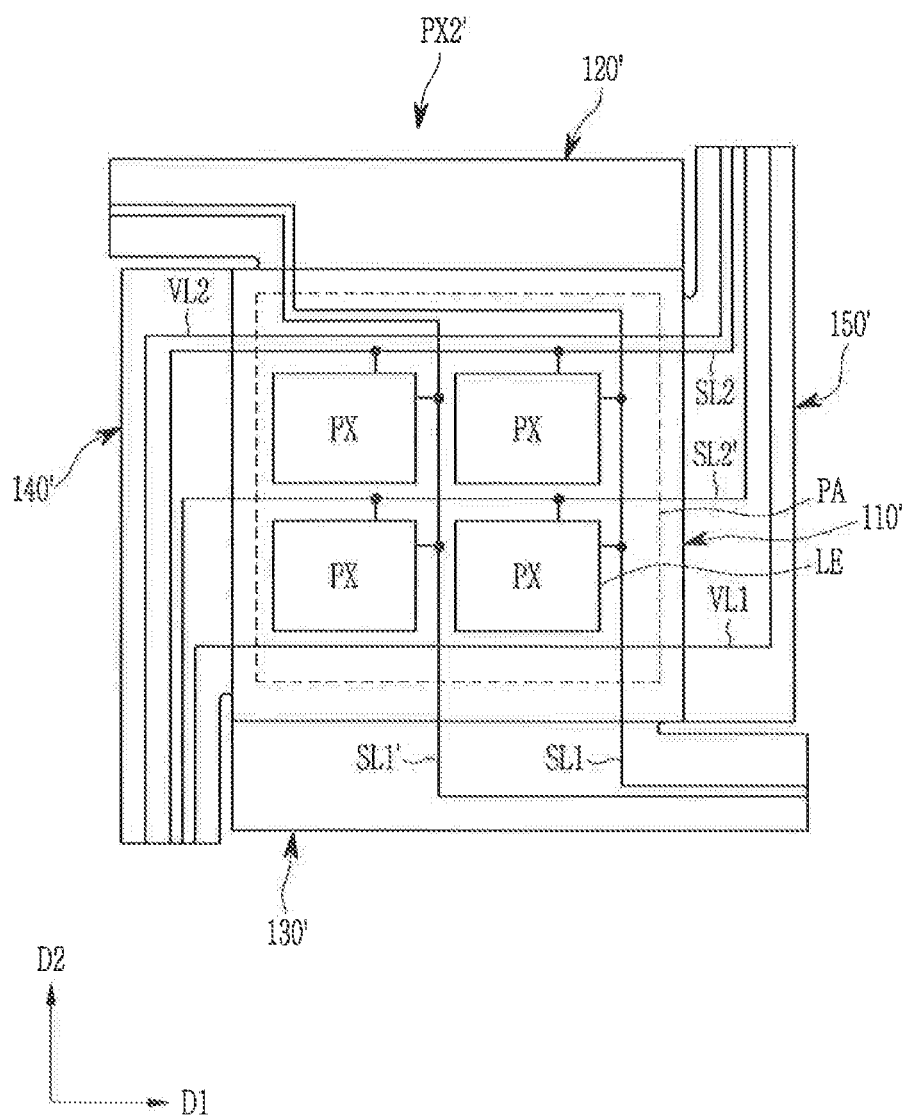
FIG. 7 is a plan view of a second pixel substrate included in a stretchable display device according to another exemplary embodiment of the inventive concept.
Figure 8:
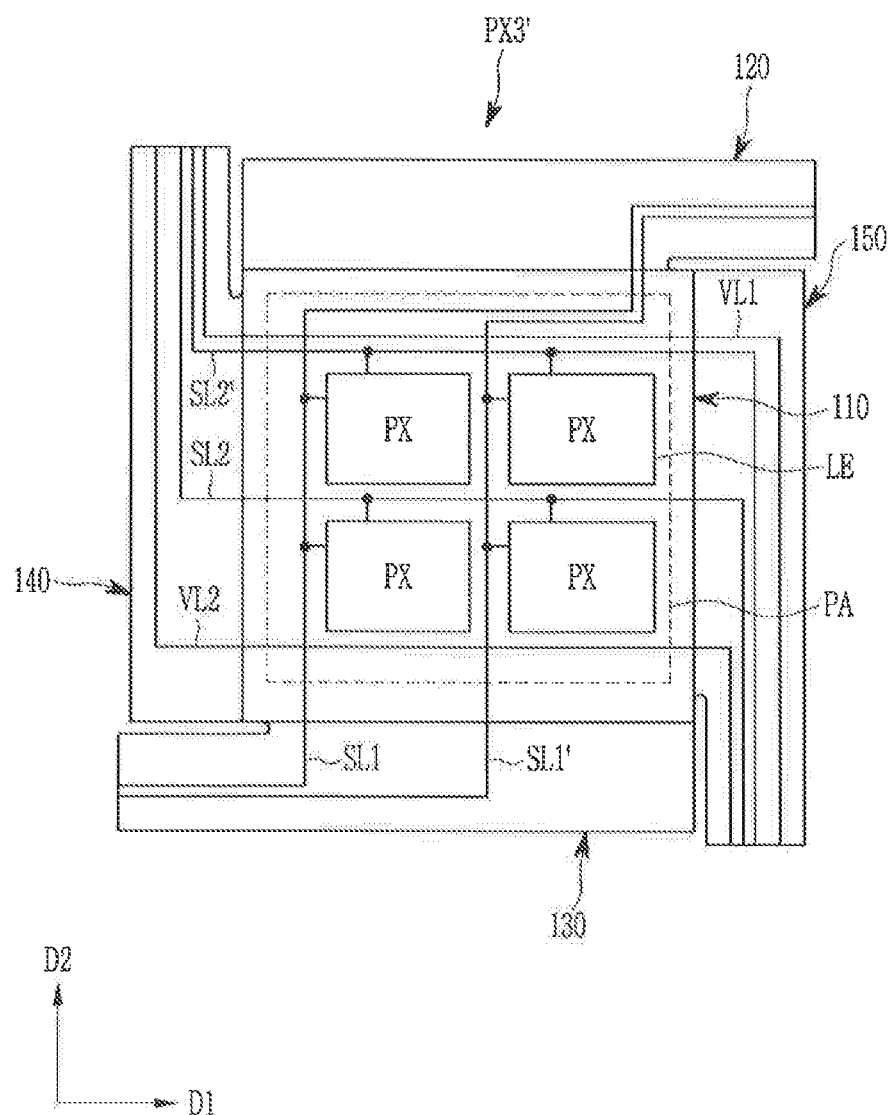
FIG. 8 is a plan view of a third pixel substrate included in a stretchable display device according to another exemplary embodiment of the inventive concept.
Figure 9:
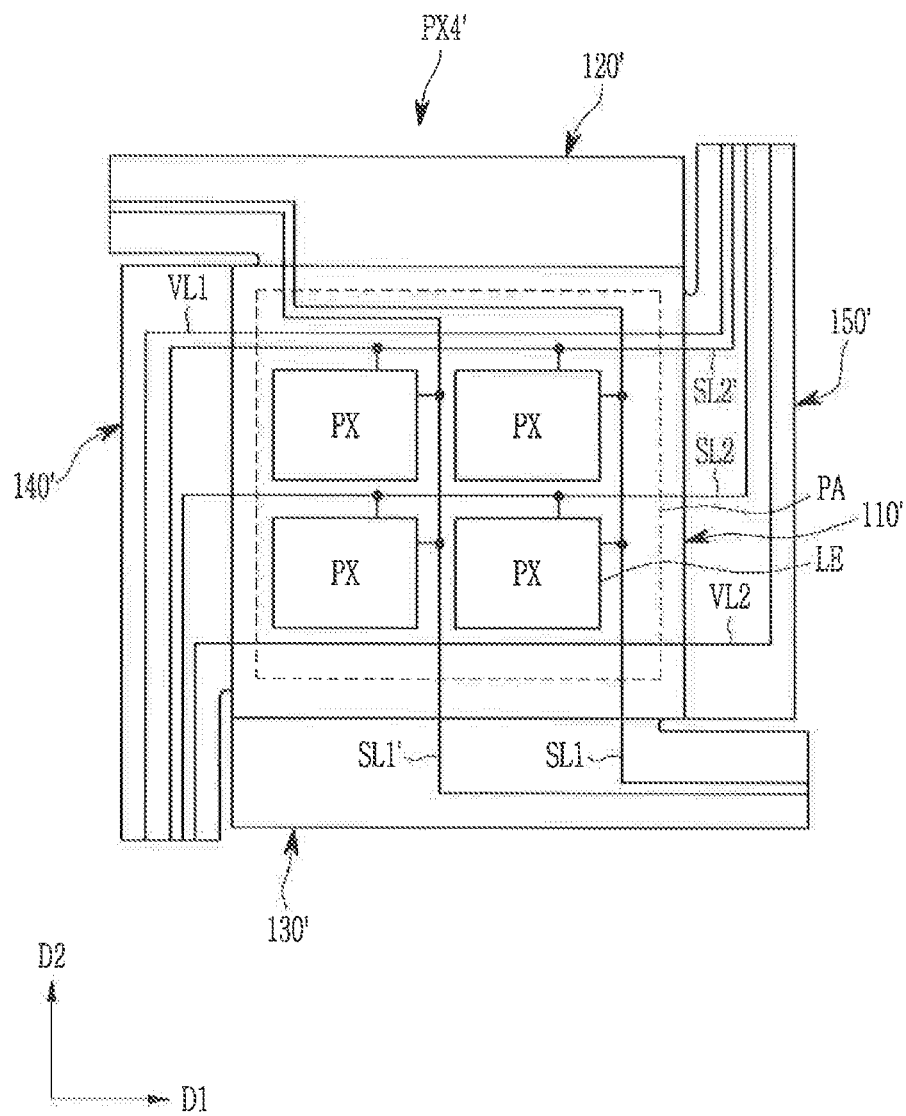
FIG. 9 is a plan view of a fourth pixel substrate included in a stretchable display device according to another exemplary embodiment of the inventive concept.

FIG. 6 is a plan view of a first pixel substrate included in a stretchable display device according to another exemplary embodiment of the inventive concept. FIG. 7 is a plan view of a second pixel substrate included in a stretchable display device according to another exemplary embodiment of the inventive concept. FIG. 8 is a plan view of a third pixel substrate included in a stretchable display device according to another exemplary embodiment of the inventive concept. FIG. 9 is a plan view of a fourth pixel substrate included in a stretchable display device according to another exemplary embodiment of the inventive concept.

First, referring to FIG. 6, four pixels PX may be disposed in a 2×2 matrix shape at the pixel area PA of the first pixel substrate PX1'. The pixel PX may include a light-emitting LE element emitting light of a predetermined color such as red, green, and blue.

As four pixels PX are disposed in the 2>2 matrix shape in the pixel area PA of the first pixel substrate PX1', the first pixel substrate PX1' may further include a first additional signal line SL1' extending to be parallel to the first signal line SL1 and a second additional signal line SL2' extending to be parallel to the second signal line SL2. In the pixel area PA of the first pixel substrate PX1 the first signal line SL1 may be connected to the pixel PX of a first column, and the first additional signal line SL1' may be connected to the pixel PX of a second column. Also, in the pixel area PA of the first pixel substrate PX1', the second signal line SL2 may be connected to the pixel PX of a first row, and the second additional signal line SL2' may be connected to the pixel PX of a second row. The first signal line SL1 and the first additional signal line SL1' may be the gate line connected to a gate electrode of a transistor (not shown) included in the plurality of pixels PX, and a gate signal may be transmitted to the plurality of pixels PX through the first signal line SL1 and the first additional signal line SL1'. The second signal line SL2 and the second additional signal line SL2' may be a data line connected to one electrode of the transistor included in the plurality of pixels PX, and a data voltage respectively corresponding to the plurality of pixels PX may be applied through the second signal line SL2 and the second additional signal line SL2'. The light-emitting element LE included in the plurality of pixels PX may be emitted with a luminance corresponding to the data voltage.

In the exemplary embodiment of FIG. 6, as shown in FIG. 1, the first power line VL1 of the first pixel substrate PX1' may be disposed furthest outside the pixel area PA of the first pixel substrate PX1 at the third hinge part 140. Also, the second power line VL2 of the first pixel substrate PX1' may be disposed furthest outside the pixel area PA of the first pixel substrate PX1' at the fourth hinge part 150. Here, a configuration in which the first power line VL1 and the second power line VL2 are respectively connected to the plurality of pixels PX is omitted, however the first power line VL1 may transmit the first power voltage to the plurality of pixels PX, and the second power line VL2 may transmit the second power voltage to the plurality of pixels PX. One of the first power voltage and the second power voltage may be applied to the light-emitting element LE, and the other may be applied to a cathode of the light-emitting element LE.

Next, referring to FIG. 7, four pixels PX may be disposed in the 2×2 matrix shape at the pixel area PA of the second pixel substrate PX2'.

As four pixels PX may be disposed in the 2×2 matrix shape at the pixel area PA of the second pixel substrate PX2', the second pixel substrate PX2' may further include a first additional signal line SL1' extending parallel to the first signal line SL1 and a second additional signal line SL2' extending parallel to the second signal line SL2. The first signal line SL1 of the second pixel substrate PX2' may be connected to the pixel PX of the second column, and the first additional signal line SL1' of the second pixel substrate PX2' may be connected to the pixel PX of the first column. Also, the second signal line SL2 of the second pixel substrate PX2' may be connected to the pixel PX of the first row, and the second additional signal line SL2' of the second pixel substrate PX2' may be connected to the pixel PX of the second row.

Also, in the exemplary embodiment of FIG. 7, as described in FIG. 2, the first power line VL1 of the second pixel substrate PX2' may be disposed furthest outside the pixel area PA of the second pixel substrate PX2' at the eighth hinge part 150'. The second power line VL2 of the second pixel substrate PX2' may be disposed furthest outside the pixel area PA of the second pixel substrate PX2' at the seventh hinge part 140'.

Next, referring to FIG. 8, four pixels PX may be disposed in the 2×2 matrix shape at the pixel area PA of the third pixel substrate PX3'. As differences compared with the exemplary embodiment of FIG. 6, the second signal line SL2 of the third pixel substrate PX3' may be connected to the pixel PX of the second row among the plurality of pixels PX, and the second additional signal line SL2' of the third pixel substrate PX3' may be connected to the pixel PX of the first row among the plurality of pixels PX. Also, as above-described in FIG. 3, the first power line VL1 of the third pixel substrate PX3' may be disposed furthest outside the pixel area PA at the fourth hinge part 150. Also, the second power line VL2 of the third pixel substrate PX3' may be disposed furthest outside the pixel area PA of the third pixel substrate PX3' at the third hinge part 140.

Next, referring to FIG. 9, four pixels PX may be disposed in the 2×2 matrix shape at the pixel area PA of the fourth pixel substrate PX4'. As differences compared with the exemplary embodiment of FIG. 7, the second signal line SL2 of the fourth pixel substrate PX4' may be connected to the pixel PX of the second row among the plurality of pixels PX, and the second additional signal line SL2' of the fourth pixel substrate PX4' may be connected to the pixel PX of the first row among the plurality of pixels PX. Also, as above-described in FIG. 4, the first power line VL1 of the fourth pixel substrate PX4' may be disposed furthest outside the pixel area PA at the seventh hinge part 140'. Also, the second power line VL2 of the fourth pixel substrate PX4' may be disposed furthest outside the pixel area PA of the fourth pixel substrate PX4' at the eighth hinge part 150'.

The first to fourth pixel substrates PX1', PX2', PX3', and PX4' exemplified in FIG. 6 to FIG. 9 may be connected as described in FIG. 5 to form the stretchable display device. In the stretchable display device including the first to fourth pixel substrates PX1', PX2', PX3', and PX4', the first power line VL1 of the first pixel substrate PX1' and the first power line VL1 of the fourth pixel substrate PX4' may be connected to each other, the second power line VL2 of the first pixel substrate PX1' and the second power line VL2 of the fourth pixel substrate PX4' may be connected to each other, the second signal line SL2 of the first pixel substrate PX1' and the second signal line SL2 of the fourth pixel substrate PX4' may be connected to each other, and the second additional signal line SL2' of the first pixel substrate PX1' and the second additional signal line SL2' of the fourth pixel substrate PX4' may be connected to each other. Also, the first power line VL1 of the second pixel substrate PX2' and the first power line VL1 of the third pixel substrate PX3' may be connected to each other, the second power line VL2 of the second pixel substrate PX2' and the second power line VL2 of the third pixel substrate PX3' may be connected to each other, the second signal line SL2 of the second pixel substrate PX2' and the second signal line SL2 of the third pixel substrate PX3' may be connected to each other, and the second additional signal line SL2' of the second pixel substrate PX2' and the second additional signal line SL2' of the third pixel substrate PX3' may be connected to each other.

In addition, in the stretchable display device including the first to fourth pixel substrates PX1', PX2', PX3', and PX4', as above-described in FIG. 5, the plurality of first power lines VL1 and the plurality of second power lines VL2 are disposed with the symmetrical structure based on the imaginary reference line RL corresponding to the second direction neighboring cutout pattern OPD2. Accordingly, even if the contact is generated between the first power lines VL1 disposed closest to each other via the second direction neighboring cutout pattern OPD2 or the contact is generated between the second power lines VL2 disposed closest to each other via the second direction neighboring cutout pattern OPD2, the driving of the stretchable display device is not affected and the stretchable display device may be normally operated.

The drawings referred to and the detailed description of the embodiments of the inventive concept disclosed herein are provided for illustrative purposes, and do not limit a meaning or limit the scope of the appended claims. Accordingly, those skilled in the art to which the embodiments of inventive concept pertain can understand that various modifications and equivalent embodiments within the spirit and scope of the inventive concept are possible. Therefore, a substantial technical protective range of the embodiments of the inventive concept will be determined based on a technical ideas of the appended claims.

What is claimed is:

1. A stretchable display device comprising:
   a first pixel substrate including a first body part and a first hinge part connected to the first body part;
   a second pixel substrate including a second body part and a second hinge part connected to the second body part and adjacent to the first pixel substrate in a first direction on a plane;
   a second direction neighboring cutout pattern disposed between the first hinge part connected to the first body part and the second hinge part connected to the second body part;
   a first power line disposed at the first hinge part connected to the first body part and applied with a first power voltage; and
   a second power line disposed at the second hinge part connected to the second body part and applied with the first power voltage, wherein the first power line and the second power line are disposed at substantially equal distances in the first direction from a reference line, wherein the reference line extends in a second direction in correspondence to the second direction neighboring cutout pattern, and wherein the second direction is perpendicular to the first direction.

2. The stretchable display device of claim 1, further comprising a plurality of first pixel substrates and second pixel substrates each respectively connected one of a plurality of body parts and a respective one of a plurality of hinge parts, wherein the second direction neighboring cutout pattern extends between two or more first pixel substrates and second pixel substrates.

3. The stretchable display device of claim 1, wherein the first power line and the second power line are disposed with a symmetrical structure based on the reference line.

4. The stretchable display device of claim 1, further comprising:
   a third power line disposed at the first hinge part connected to the first body part and applied with a second power voltage; and
   a fourth power line disposed at the second hinge part connected to the second body part and applied with the second power voltage, and
   the third power line and the fourth power line are disposed at a same distance in the first direction based on the reference line.

5. The stretchable display device of claim 4, wherein the third power line and the fourth power line are disposed with a symmetrical structure based on the reference line.

6. The stretchable display device of claim 4, further comprising:

a first data line disposed at the first hinge part connected to the first body part and applied with a first data voltage; and
   a second data line disposed at the second hinge part connected to the second body part and applied with a second data voltage, and
   the first data line and the second data line are disposed at the same distance based on the reference line in the first direction.

7. The stretchable display device of claim 6, wherein the first data line is disposed between the first power line and the third power line, and the second data line is disposed between the second power line and the fourth power line.

8. The stretchable display device of claim 7, wherein the first power line is disposed closer to the reference line than the third power line, and the second power line is disposed closer to the reference line than the fourth power line.

9. The stretchable display device of claim 7, wherein the third power line is disposed closer to the reference line than the first power line, and the fourth power line is disposed closer to the reference line than the second power line.

10. The stretchable display device of claim 4, further comprising:
    a third pixel substrate adjacent to the second pixel substrate in the second direction on a plane;
    a fourth pixel substrate adjacent to the first pixel substrate in the second direction on a plane; and
    a first direction neighboring cutout pattern disposed between the second pixel substrate and the third pixel substrate and between the first pixel substrate and the fourth pixel substrate.

11. The stretchable display device of claim 10, wherein the first power line is connected to the fourth pixel substrate and is disposed in a zigzag pattern that bypasses the first direction neighboring cutout pattern, and the second power line is connected to the third pixel substrate and is disposed in the zigzag pattern that bypasses the first direction neighboring cutout pattern.

12. The stretchable display device of claim 11, wherein the third power line is connected to the fourth pixel substrate and is disposed in the zigzag pattern that bypasses the first direction neighboring cutout pattern, and the fourth power line is connected to the third pixel substrate and is disposed in the zigzag pattern that bypasses the first direction neighboring cutout pattern.

13. The stretchable display device of claim 10, wherein first body part has four sides, and the first power line is extended to the first body part by bypassing a third cutout direction neighboring cutout pattern and is bent at a third hinge part connected to a third side of the first body part.

14. The stretchable display device of claim 1, wherein each of the first body part and the second body part includes at least four pixels disposed in at least a 2×2 matrix shape, and each of the at least four pixels includes a light-emitting element emitting light of a predetermined color.

15. A stretchable display device comprising:
    a first pixel substrate;
    a second pixel substrate connected to the first pixel substrate in a first direction on a plane;
    a third pixel substrate connected to the second pixel substrate in a second direction on a plane;
    a fourth pixel substrate connected to the first pixel substrate in the second direction on a plane;
    a first direction neighboring cutout pattern disposed between the first pixel substrate and the fourth pixel substrate and between the second pixel substrate and the third pixel substrate;

a second direction neighboring cutout pattern disposed between the first pixel substrate and the second pixel substrate and between the third pixel substrate and the fourth pixel substrate;

a first power line applied with a first power voltage, a first data line applied with a first data voltage, and a third power line applied with a second power voltage disposed at the first pixel substrate and the fourth pixel substrate; and a second power line applied with the first power voltage, a second data line applied with a second data voltage, and a fourth power line applied with the second power voltage disposed at the second pixel substrate and the third pixel substrate, wherein the first data line is disposed between the first power line and the third powerline, wherein the second data line is disposed between the second power line and the fourth power line, wherein a first arrangement of the first power line, the first data line, and the third power line and a second arrangement of the second power line, the second data line, and the fourth power line are symmetrical structure based on a reference line, and wherein the reference line extends in the second direction corresponding to the second direction neighboring cutout pattern.

16. The stretchable display device of claim 15, wherein the first direction is perpendicular to the second direction.

17. The stretchable display device of claim 16, wherein the first power line and the second power line are disposed in a zigzag pattern that bypasses the first direction neighboring cutout pattern.

18. The stretchable display device of claim 17, wherein the first power line and the second power line are disposed at a same distance in the first direction based on the reference line.

19. The stretchable display device of claim 15,
wherein the third power line and the fourth power line are disposed with the symmetrical structure based on the reference line.

20. The stretchable display device of claim 19, wherein the third power line and the fourth power line are disposed in a zigzag pattern that bypasses the first direction neighboring cutout pattern.

21. The stretchable display device of claim 20, wherein the third power line and the fourth power line are disposed at a same distance based on the reference line in the first direction.

22. The stretchable display device of claim 19,
wherein the first data line and the second data line are disposed with a symmetrical structure based on the reference line.

* * * * *